US010453971B2

United States Patent
Magaña-Sandoval et al.

(10) Patent No.: US 10,453,971 B2
(45) Date of Patent: Oct. 22, 2019

(54) MODE CONVERTER AND QUADRANT PHOTODIODE FOR SENSING OPTICAL CAVITY MODE MISMATCH

(71) Applicants: Fabian Magaña-Sandoval, Westminster, CA (US); Stefan Ballmer, Syracuse, NY (US); Thomas Vo, Seattle, WA (US); Daniel Vander-Hyde, La Habra, CA (US); Jax Sanders, Milwaukee, WI (US)

(72) Inventors: Fabian Magaña-Sandoval, Westminster, CA (US); Stefan Ballmer, Syracuse, NY (US); Thomas Vo, Seattle, WA (US); Daniel Vander-Hyde, La Habra, CA (US); Jax Sanders, Milwaukee, WI (US)

(73) Assignee: SYRACUSE UNIVERSITY, Syracuse, NY (US)

( * ) Notice: Subject to any disclaimer, the term of this patent is extended or adjusted under 35 U.S.C. 154(b) by 0 days.

(21) Appl. No.: 16/019,889

(22) Filed: Jun. 27, 2018

(65) Prior Publication Data
US 2018/0374967 A1    Dec. 27, 2018

Related U.S. Application Data

(60) Provisional application No. 62/525,432, filed on Jun. 27, 2017.

(51) Int. Cl.
*H01L 31/02* (2006.01)
*H04L 27/22* (2006.01)
(Continued)

(52) U.S. Cl.
CPC .... *H01L 31/02024* (2013.01); *G02B 23/2407* (2013.01); *G02B 27/0955* (2013.01);
(Continued)

(58) Field of Classification Search
CPC combination set(s) only.
See application file for complete search history.

(56) References Cited

U.S. PATENT DOCUMENTS

2003/0128917 A1*   7/2003   Turpin ................ G02B 6/2861
                                                         385/24
2006/0061770 A1*   3/2006   Erskine .................... G01J 3/10
                                                         356/484

(Continued)

OTHER PUBLICATIONS

Sanders .Advanced Gravitational Wave Detectors and Detection: Arm Length Stabilization and Directed Searches for Isolated Neutron Stars,Jun. 10, 2016, pp. 56-75, 100, URL : http://deepblue.lib.umich.edU/bitstream/2027.42/120826/1/jrsandrs_1.pdf).*

(Continued)

*Primary Examiner* — Omar S Ismail
(74) *Attorney, Agent, or Firm* — Bond Schoeneck & King, PLLC; George R. McGuire; David Nocilly

(57) ABSTRACT

A new technique for sensing optical cavity mode mismatch using a mode converter formed from a cylindrical lens mode converting telescope, radio frequency quadrant photodiodes (RFQPDs), and a heterodyne detection scheme. The telescope allows the conversion of the Laguerre-Gauss basis to the Hermite-Gauss (HG) basis, which can be measured with quadrant photodiodes. Conversion to the HG basis is performed optically, measurement of mode mismatched signals is performed with the RFQPDs, and a feedback error signal is obtained with heterodyne detection.

18 Claims, 12 Drawing Sheets

(51) Int. Cl.
G02F 1/01 (2006.01)
G02B 23/24 (2006.01)
G02B 27/09 (2006.01)
H04L 27/34 (2006.01)

(52) U.S. Cl.
CPC .......... *G02F 1/0136* (2013.01); *H04L 27/223* (2013.01); *H04L 27/34* (2013.01); *G02F 2001/0142* (2013.01)

(56) References Cited

U.S. PATENT DOCUMENTS

| | | | |
|---|---|---|---|
| 2008/0208511 A1* | 8/2008 | Trainer | G01N 15/0205 702/128 |
| 2010/0225913 A1* | 9/2010 | Trainer | G01N 15/0205 356/338 |
| 2014/0152986 A1* | 6/2014 | Trainer | G01N 15/0205 356/336 |

OTHER PUBLICATIONS

P.Fulda, Alignment sensing for optical cavities using radio-frequency jitter modulation—Applied Optics, vol. 56 No. 13, May 1, 2017, pp. 3879-3886.*

B Sorazu, Experimental test of higher-order Laguerre-Gauss modes in the 10 m Glasgow prototype interferometer, Apr. 2, 2013, IOP, Classical and Quantum Gravity, pp. 2-18.*

A Gatto, Fabry-Perot-Michelson interferometer using higher-order Laguerre-Gauss modes, Dec. 31, 2014, American Physical Society, Physical Review, pp. 2-7.*

* cited by examiner

MODE CONVERTER AND QUADRANT PHOTODIODE FOR SENSING OPTICAL CAVITY MODE MISMATCH

CROSS-REFERENCE TO RELATED APPLICATIONS

The present application claims priority to U.S. Provisional No. 62/525,432, filed on Jun. 27, 2017.

STATEMENT REGARDING FEDERALLY SPONSORED RESEARCH AND DEVELOPMENT

This invention was made with government support under Grant No. PHY-1352511 awarded by the National Science Foundation (NSF). The government has certain rights in the invention.

BACKGROUND OF THE INVENTION

1. Field of the Invention

The present invention relates to optical cavity mode mismatch sensors and, more particularly, to a mode matching sensor telescope.

2. Description of the Related Art

Higher order mode-sensing techniques currently utilize CCD cameras, clipped photodiode arrays or bullseye photodiodes. These sensors provide feedback error signals for correcting either the beam waist size or waist location, but also have drawbacks. Some of the drawbacks include slow signal acquisition for CCD sensors, 50 percent reduction in sensing capabilities for clipped arrays, and expensive custom parts that are difficult to setup for bullseye photodiodes. For example, because a clipped photodiode array requires a split in the power between the diodes, sensing capabilities are reduced by 50 percent. Similarly, while bullseye photodiodes offer a very convenient geometry to sense Laguerre-Gauss (LG) modes, they are not very commonly manufactured, difficult to setup and thus not very cost effective.

BRIEF SUMMARY OF THE INVENTION

The present invention is a new approach for sensing optical cavity mode mismatch by the use of a cylindrical lens mode converter telescope, radio frequency quadrant photodiodes (RFQPDs), and a heterodyne detection scheme. A cylindrical lens mode converter telescope allows the conversion of beam profiles from the LG basis to the Hermite-Gauss (HG) basis, which can be easily measured with QPDs. The present invention transforms mature alignment sensors into equally mature mode matching sensors. By applying the mode converter in reverse, the $LG_{10}$ mode turns into an $HG_{11}$ mode, which is shaped perfectly for a quadrant photodiode. After the quadrant photodiode, well-known heterodyne detection methods may be used to extract a robust mode matching error signal. Converting to the HG basis is thus performed optically, and mode mismatched signals are measured using widely produced RFQPDs to obtain a feedback error signal with heterodyne detection.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1:
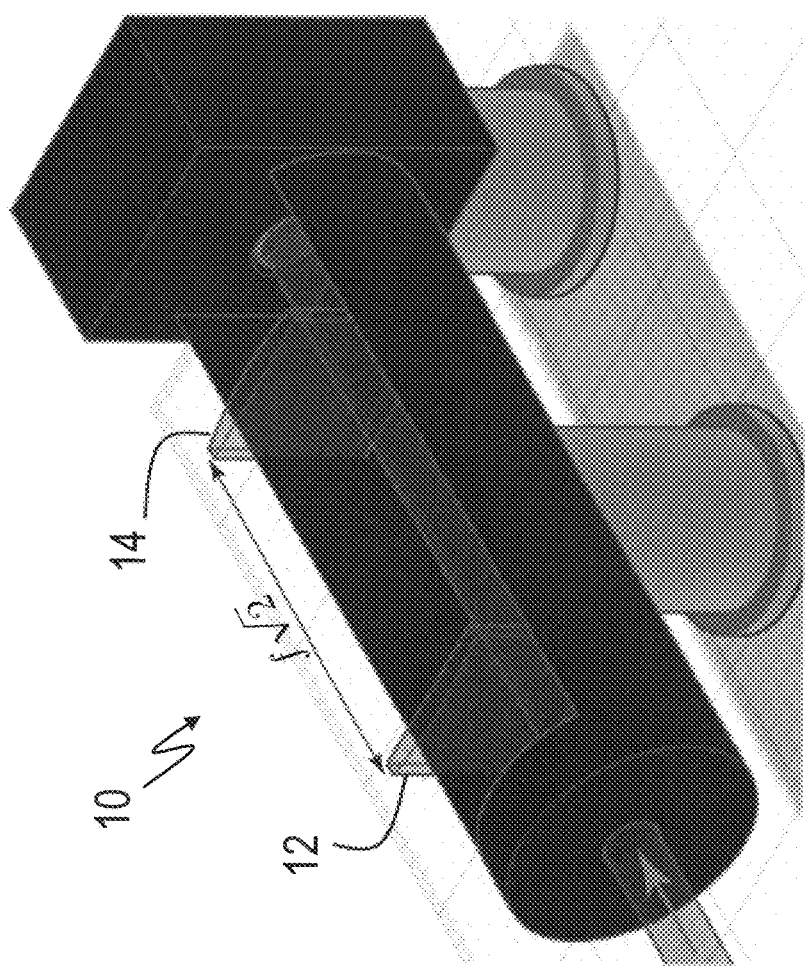
FIG. 1 is a perspective view of a mode mismatch signal conversion unit according to the present invention.
Figure 2:
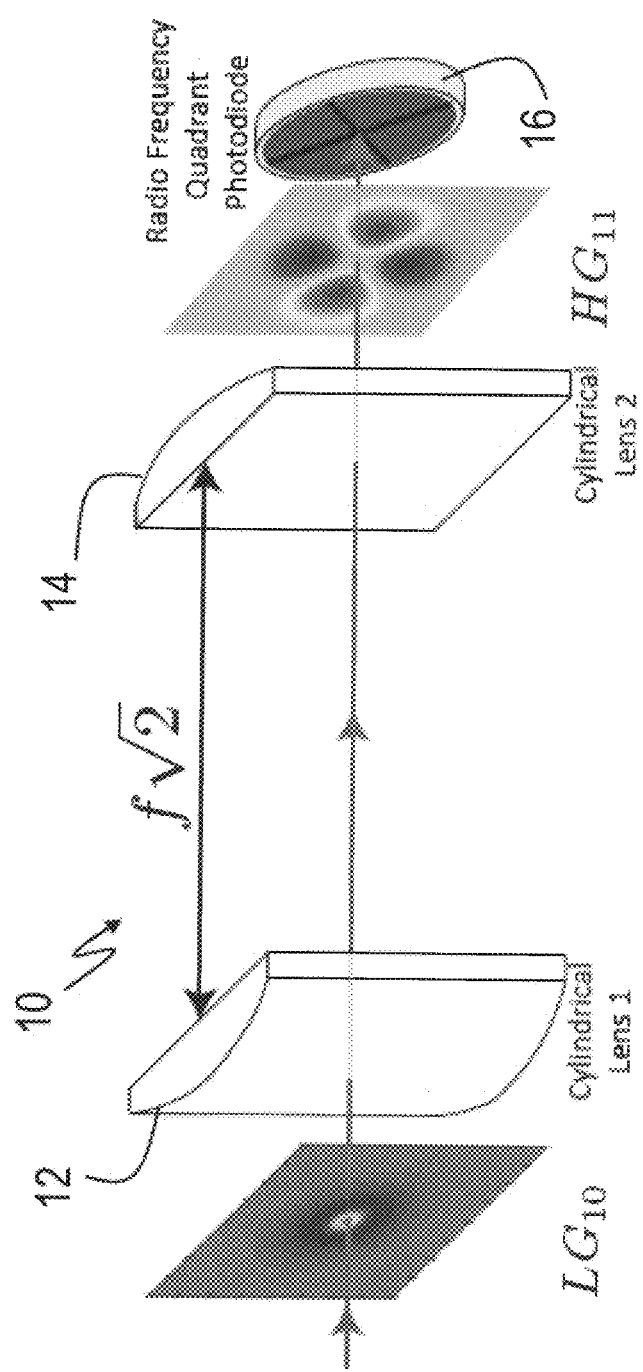
FIG. 2 is a schematic of a mode mismatch signal conversion unit according to the present invention.

Referring to the figures, wherein like numerals refer to like parts throughout, there is seen in FIGS. 1 and 2, a mode converter 10 for converting a mode mismatch signal carrying $LG_{10}$ mode to a $HG_{11}$ mode and sensed with a quadrant photodiode 16. The $LG_{10}$ passes through two cylindrical lenses 12 and 14 spaced by their focal length multiplied by $\sqrt{2}$. It is critical that the focal length be chosen as a function of the incoming beam waist size $f(w_o)=(\pi w_o^2)/\lambda(1+1/\sqrt{2})$.

Figure 8:
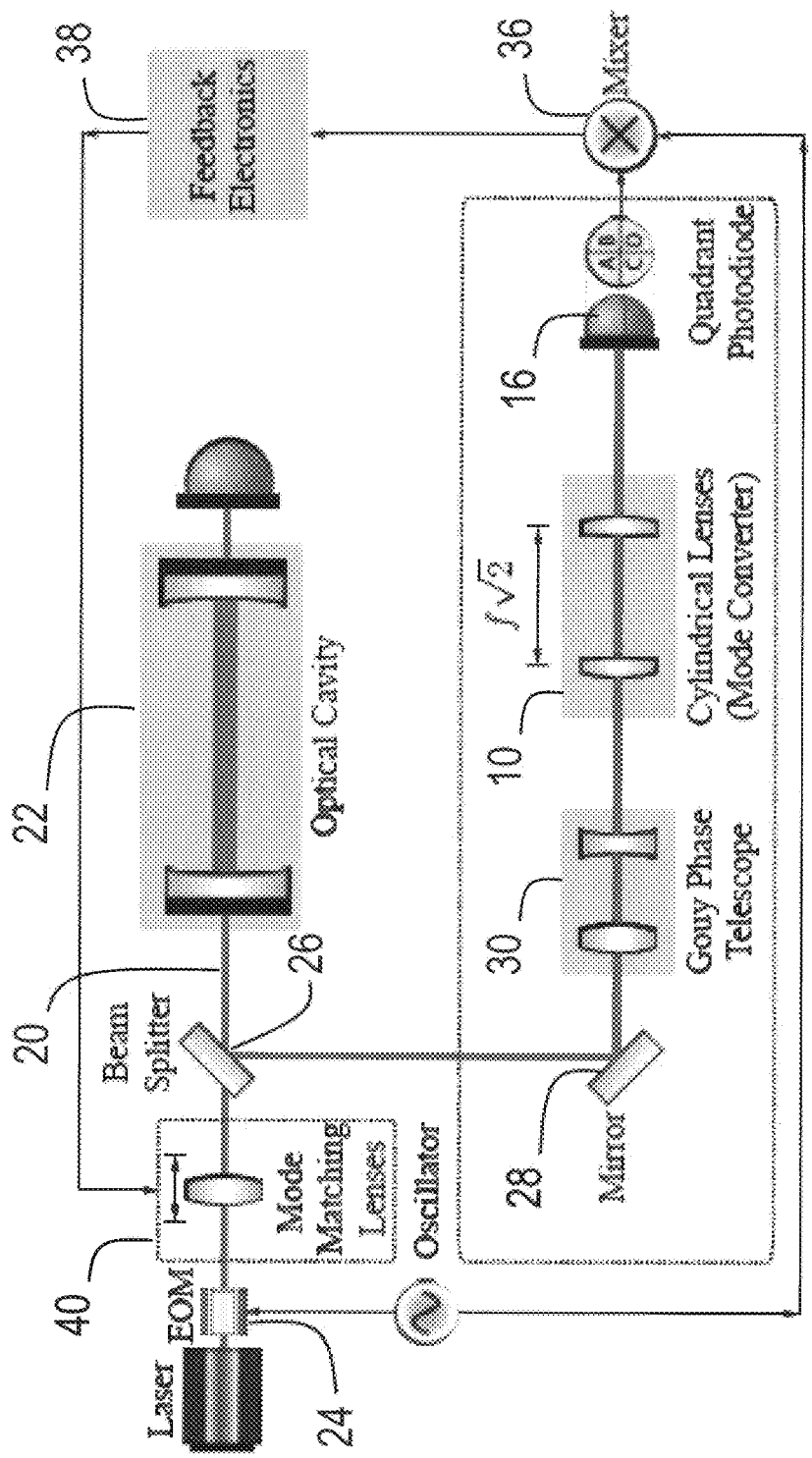
FIG. 8 is a schematic of the sensing and correcting mode mismatch of a laser to an optical cavity according to the present invention.

Referring to FIG. 8, a laser beam 20 is mode mismatched to an optical cavity 22. Sidebands are created by the Electro-Optic Modulator (EOM) 24, which are used for the heterodyne detection. The optical cavity reflection contains mismatch signals and, using a beam splitter 26 and mirror 28, is guided through a Gouy phase telescope 30 (for proper waist location placement) and finally through a mode converter 10 such as that seen in FIG. 1 or FIG. 2. The radio frequency quadrant photodiode signal from a quadrant photodiode 16 is demodulated by a mixer 36 and passed through feedback electronics 38 that control the mode matching actuator 40 (depicted as a displacement actuator, but could also be thermally deformable). The feedback electronics 38 also compare the four quadrants to extract the mode mismatching error signal.

Figure 3:
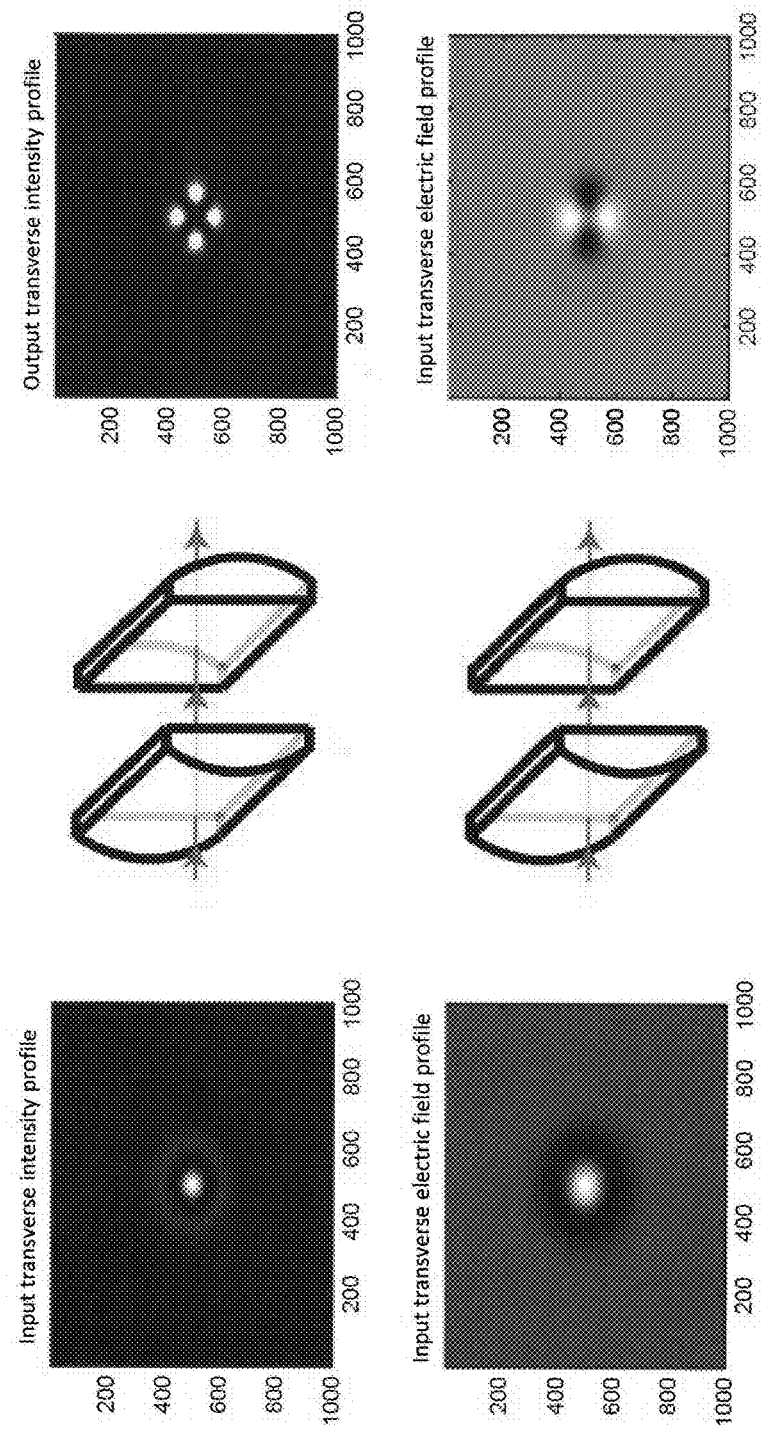
FIG. 3 is a series of graphs of the passing of the $LG_{10}$ mode through the mode converting telescope using Fourier transform functions in MATLAB according to the present invention.
Figure 4:
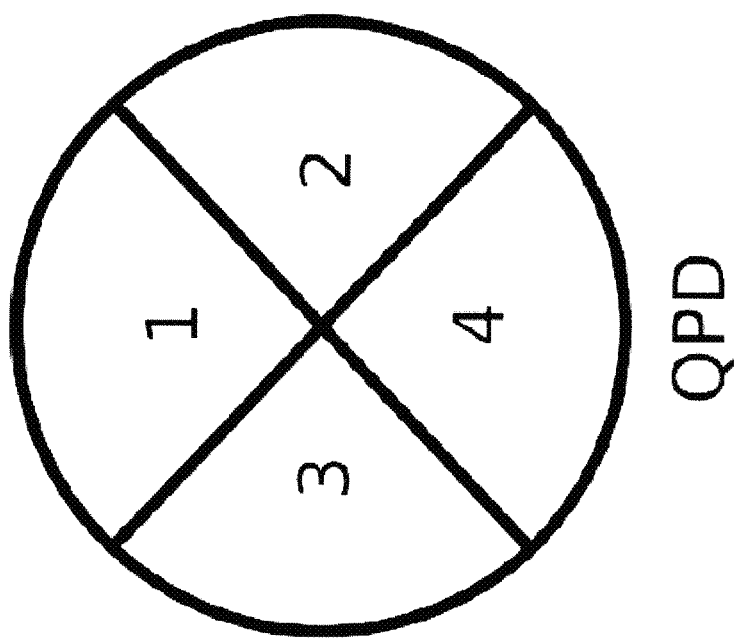
FIG. 4 is a schematic of a quadrant photodiode pattern that takes advantage of the intensity pattern of the mode converter of the present invention.
Figure 5:
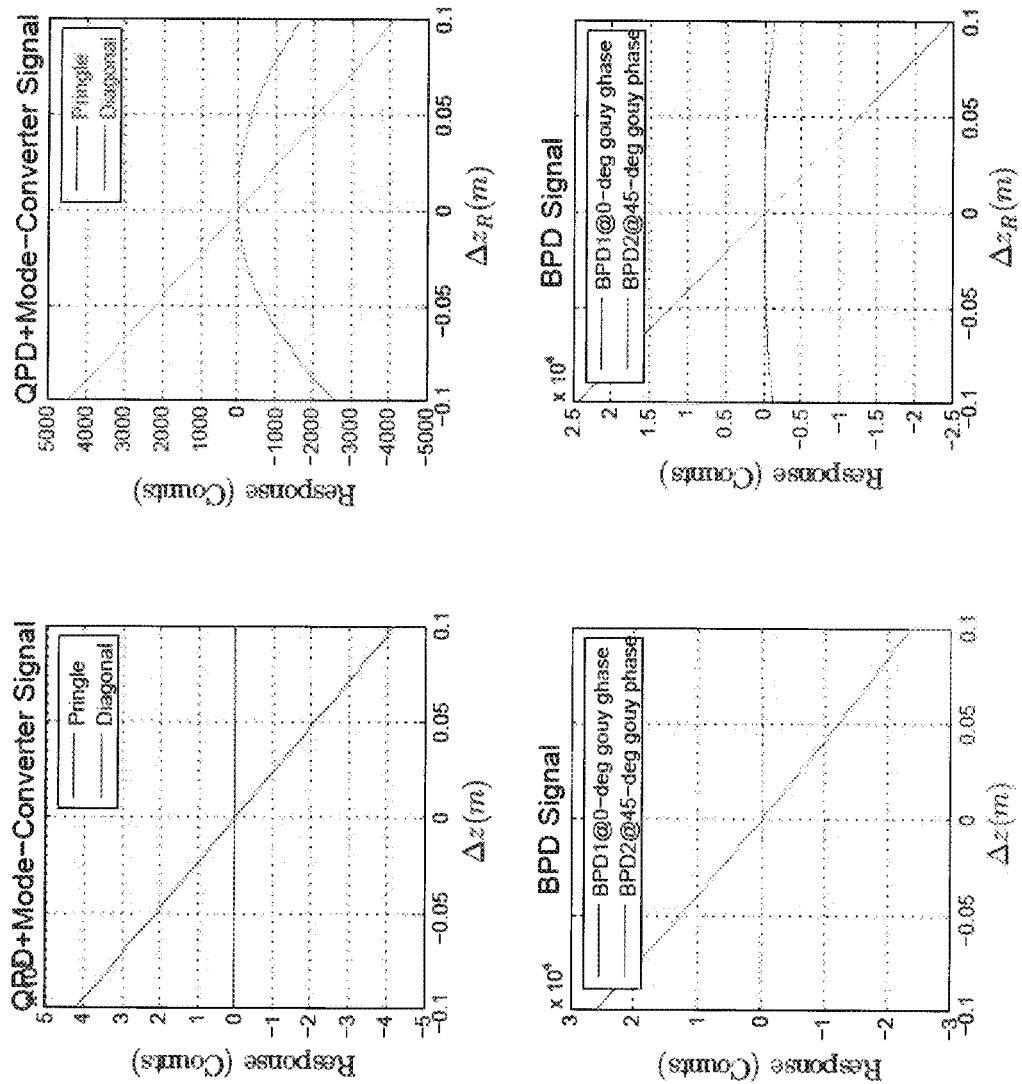
FIG. 5 is a series of graphs of the error signals extracted from the mode converter using the program FINESSE of the present invention.

In order to implement a mode converter into an actively controlled optical system, it is necessary to derive an error signal from the output that is linearly proportional to the waist position or size of the optical cavity. This is done by applying a mask to the output images as seen in FIG. 3, FIG. 4 and FIG. 5 which isolates the power on each section of a quadrant photodiode. MATLAB was used to pass the $LG_{10}$ mode through the mode converting telescope function. The output result is a $HG_{11}$ mode rotated 45 degrees in the transverse direction. FIG. 4 shows the photodiode pattern which takes advantage of the intensity pattern provided by mode converter. FIG. 5 shows a comparison of the error signals derived by the mode converter QPD vs. the bullseye photodiode and the error signals extracted from the mode converter show a linear response to shifts in the waist location.

Typical optical cavity alignment sensing requires the ability to measure the $HG_{01}$ and $HG_{10}$ modes with a quadrant photodiode. Mode mismatch manifests itself as concentrically symmetric LG modes. Since the whole beam will be affected by the mode converter, it is worthwhile to examine what happens to the alignment signals after they pass through. Passing a well aligned LG mode through the mode converter requires no specific rotation angle since the LG mode is radially symmetric. The cylindrical lenses will always produce a HG mode that is rotated 45 degrees from the cylindrical lens focusing axis in FIG. 3. As seen in FIG. 5, optical power of higher order misalignment modes are not affected by the mode converting telescope. However, note that there is an electric field sign flip.

Figure 7:
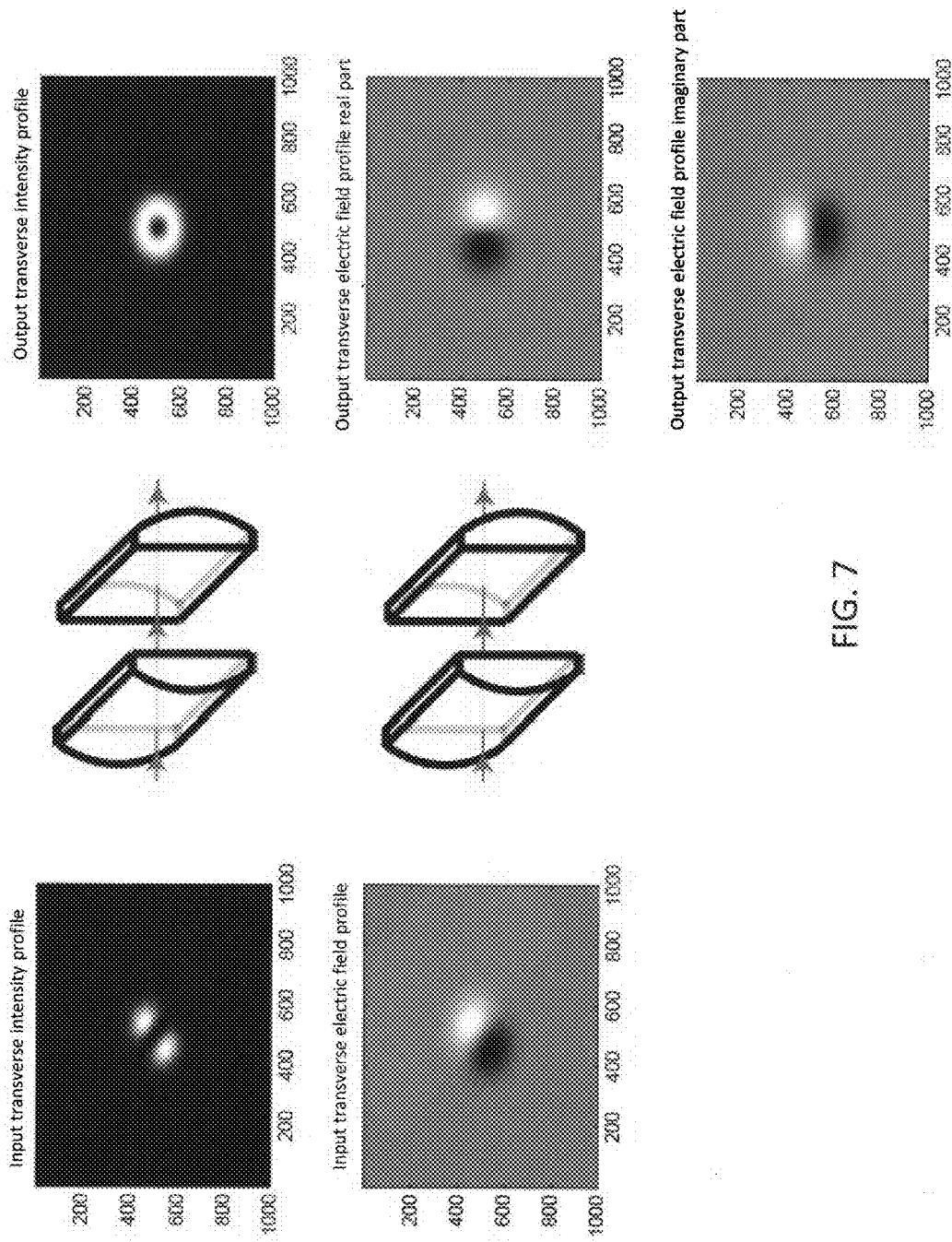
FIG. 7 is a series of graphs of the conversion of the rotated $HG_{01}$ mode to an LG mode using MATLAB according to the present invention.

Passing $HG_{01}$ or $HG_{10}$ alignment signals through the mode converter does require a specific rotation angle. The alignment signals must enter at 0 degrees with respect to the focusing axis to maintain their shape. If this condition is not respected then mixing of the modes will occur, as seen in FIG. 7.

The mode converter does not affect the misalignment signals in a notable way as long as the alignment modes enter at 0 degrees with respect to the focusing axis.

Figure 6:
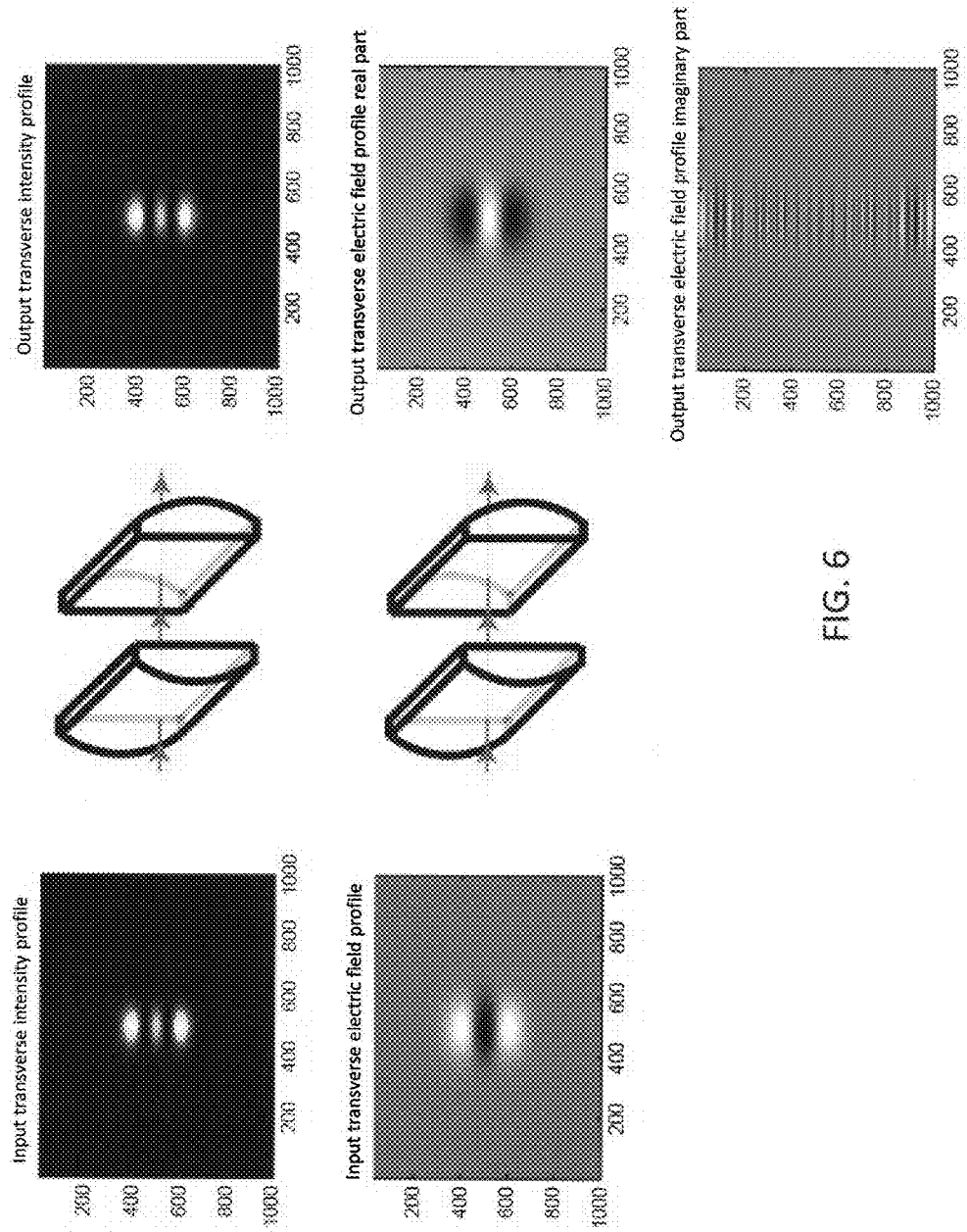
FIG. 6 is a series of graphs of the optical power of higher order misalignment modes of the mode converter of the present invention.

FIG. 6 shows how alignment modes perpendicular to the lens axis are completely unchanged, while alignment signals parallel to the lens axis have their electric field flipped. Since power is amplitude squared, the photodiodes will not measure anything different and hence the alignment signals pass through the mode converter are just as useful as before.

EXAMPLE

Figure 9:
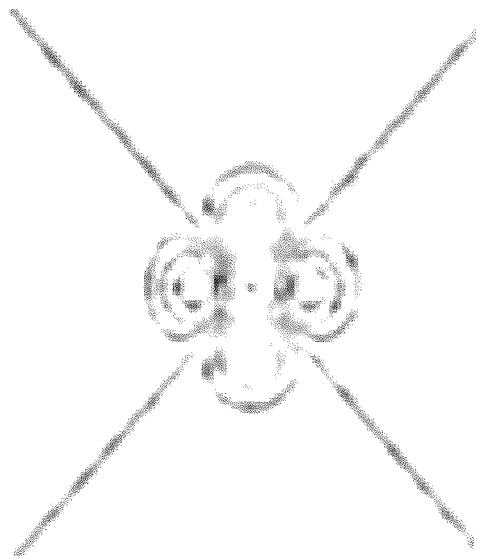
FIG. 9 is a series of MATLAB images demonstrating conversion of the $LG_{10}$ mode to the $HG_{11}$ mode according to the present invention.
Figure 9:
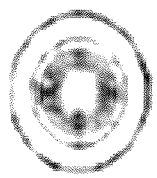
Figure 10:
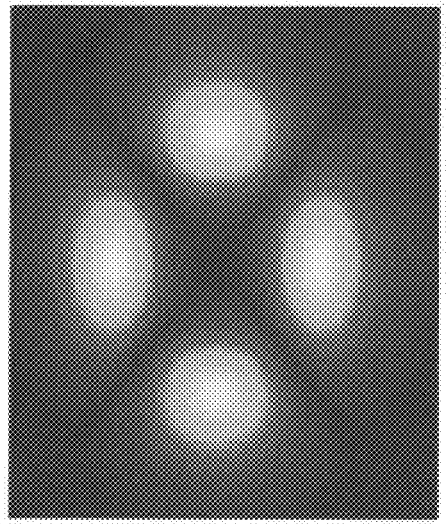
FIG. 10 is a series of MATLAB images and scripts generating mode mismatch and applying Fourier transforming telescope functions according to the present invention.
Figure 10:
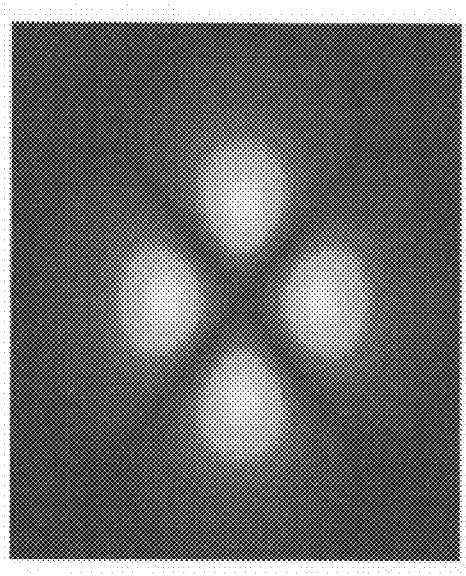
Figure 10:
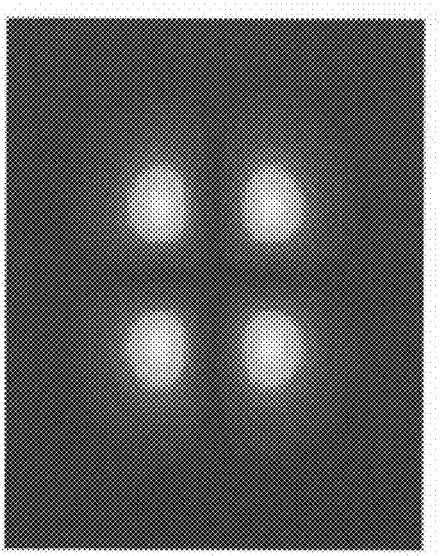

Computer simulation provided a quick method for testing our prediction before performing the experiment. A combination of FINESSE, which mainly uses ABCD matrix math at its core, and MATLAB was selected for the experiment. FINESSE was chosen because it had previously been used to generate mode mismatching signals from an optical cavity that were sensed with bullseye photodiodes and thus provides a good baseline for simulation comparison. MATLAB was used as a means to process our transverse electric field expression using Fourier Optics. FINESSE was used to produce the mode mismatched cavity in FIG. 9. As seen in FIGS. 9 and 10, an exemplary MATLAB study shows that the present invention was able to convert the $LG_{10}$ mode to the $HG_{11}$ mode. Fourier optics were used to clearly show the conversion. As seen in FIG. 9, MATLAB was used to pass the $LG_{10}$ mode through the mode converting telescope. The output result is clearly a $HG_{11}$ mode rotated 45 degrees in the transverse direction. Referring to FIG. 10, a MATLAB script was used to plot higher order HG modes and subtract them pixel by pixel. The $|HG_{11}|$ mode is plotted directly in the top left of FIG. 10. In the bottom center of FIG. 10, the sum of $|HG_{10}|$ and $|HG_{01}|$ may be seen. On the top right, $|HG_{20}|-|HG_{02}|$ may be seen. The peaks are much closer together in the $HG_{11}$ mode. However, the beam composition looks similar enough to $HG_{11}$ that this could still be detected on a quadrant photodiode. Thus, it is possible to measure mode mismatching signals using well developed alignment sensors.

Appendix

The complex beam parameter of a Gaussian beam with Rayleigh range $z_R$ is defined as:

$$q = \tilde{z} + i\tilde{z}_R. \tag{1}$$

Beam size w and phase front radius of curvature R are then given by $$\frac{1}{q} = \frac{1}{R} - i\frac{\lambda}{\pi w^2}, \tag{2}$$

where $\lambda = 2\pi/k$ is the wave length of the light. It allows expressing the Gaussian beam in a simple form:

$$\Psi(x, y, q) = A(x, y, q)e^{-ikz} \tag{3}$$

$$A(x, y, q) = \frac{A}{q}e^{-ik\frac{x^2+y^2}{2q}} \tag{4}$$

where A is a complex constant (amplitude). It can be helpful to introduce the field amplitude on the optical axis, $\psi = A/q$, which now evolves along the z-axis due to the Gouy phase evolution. Thus, for any given location on the optical axis z, the Gaussian beam is completely described by the two complex parameters $\psi$ and q. The main advantage of this formalism becomes apparent when using ray-transfer matrices M defined in geometric optics (e.g. Saleh, Teich) to represent the action of a full optical system. The two complex parameters after the system $(q_f, \psi_f)$, are given in terms of the initial parameters $(q_i, \psi_i)$ by $$M\begin{pmatrix} \frac{1}{\psi_i} \\ \frac{1}{\psi_i q_i} \end{pmatrix} = \begin{pmatrix} \frac{1}{\psi_f} \\ \frac{1}{\psi_f q_f} \end{pmatrix}, \tag{5}$$

and the change of the Gouy phase through the system, $\Delta\phi$, is given by $$e^{i\Delta\phi} = \sqrt{\frac{\psi_f}{\psi_f^*}\frac{\psi_i^*}{\psi_i}}. \tag{6}$$

This expression is consistent with the usual definition of Gouy phase for a Gaussian beam as $\phi = \arctan z/z_R$, and can be proven by verifying it for a pure free-space propagation and a pure lens.

If astigmatism is introduced, either intentionally with cylindrical lenses or accidentally through imperfections, cylindrical symmetry around the beam axis will be lost. As long as we introduce this astigmatism along a pre-determined axis (say the x-axis), we can simply proceed by introducing separate q-parameters for the x- and y-axis, $q_x$ and $q_y$. Since ray-transfer matrices are introduced with only 1 transverse axis, the propagation of $q_x$ and $q_y$ is done with ray-transfer matrices defined for the corresponding transverse axis. Thus we now have a separately-defined beam size $w_x$, $w_y$, phase front radius of curvature $R_x$, $R_y$, Rayleigh range $z_{Rx}$, $z_{Ry}$ and Gouy phase ϕx and ϕy for each of the two transverse directions. The corresponding fundamental Gaussian beam is given by $$\Psi(x, y, q_x, q_y) = A(x, y, q_x, q_y)e^{-ikz} \quad (7)$$

$$A(x, y, q_x, q_y) = \frac{A}{\sqrt{q_x q_y}} e^{-ik\frac{x^2}{2q_x}} e^{-ik\frac{y^2}{2q_y}} \quad (8)$$

where A is again a complex amplitude. Next we introduce the Hermite-Gaussian basis set corresponding to the fundamental Gaussian beam. In the literature this is typically done only relative to a single q-parameter, but directly generalizes to the case with separate $q_x$ and $q_y$ parameters:

$$\Psi_{nm}(x, y, q_x, q_y) = A_{nm}(x, y, q_x, q_y)e^{-ikz} \quad (9)$$

$$A_{nm}(x, y, q_x, q_y) = NA_n(x, q_x)A_m(y, q_y) \quad (10)$$

$$A_p(\xi, q_\xi) = e^{ip\phi_\xi} \sqrt{\frac{1}{2^p p!}} \psi_\xi H_p\left(\sqrt{2}\frac{\xi}{w_\xi}\right) e^{-ik\frac{\xi^2}{2q_\xi}} \quad (11)$$

$$\psi_\xi = \sqrt{\frac{2}{\pi}} \frac{e^{i\phi_\xi}}{w_\xi} = \sqrt{\frac{2z_R}{\lambda}} \frac{i}{q_\xi} \quad (12)$$

$$H_0(\eta) = 1, \quad H_{p+1}(\eta) = 2\eta H_p(\eta) - \frac{d}{d\eta} H_p(\eta) \quad (13)$$

Here, we redefined the overall amplitude N such that the total power P in a mode is simply given by $P=\int|\Psi_{nm}|^2 dxdy=|N|^2$. That equation (8) is of the same form can be seen using the identity $iz_R/q=e^{i\phi}w_0/w$. Furthermore, $\psi_\xi$ was defined in analog to the field amplitude $\psi$ introduced after equation (4), that is the field amplitude on the optical axis of the fundamental mode. It thus evolves, together with $q_\xi$, according to equations (5) and (6). Note though that there is an extra Gouy phase term for the higher order modes that is explicitly excluded from the definition of $\psi_\xi$. As a result, the overall Gouy phase evolution of $\Psi_{nm}(\tilde{x}, y, q_x, q_y)$ is proportional to $e^{i(n+1/2)\phi_x + i(m+1/2)\phi_y}$.

As expected, these modes still solves the paraxial Helmholtz equation $$\left(\Delta_T - 2ik\frac{\partial}{\partial z}\right) A_{nm}(x, y, q_x, q_y) = 0 \quad (14)$$

exactly.

Example 2

Figure 11:
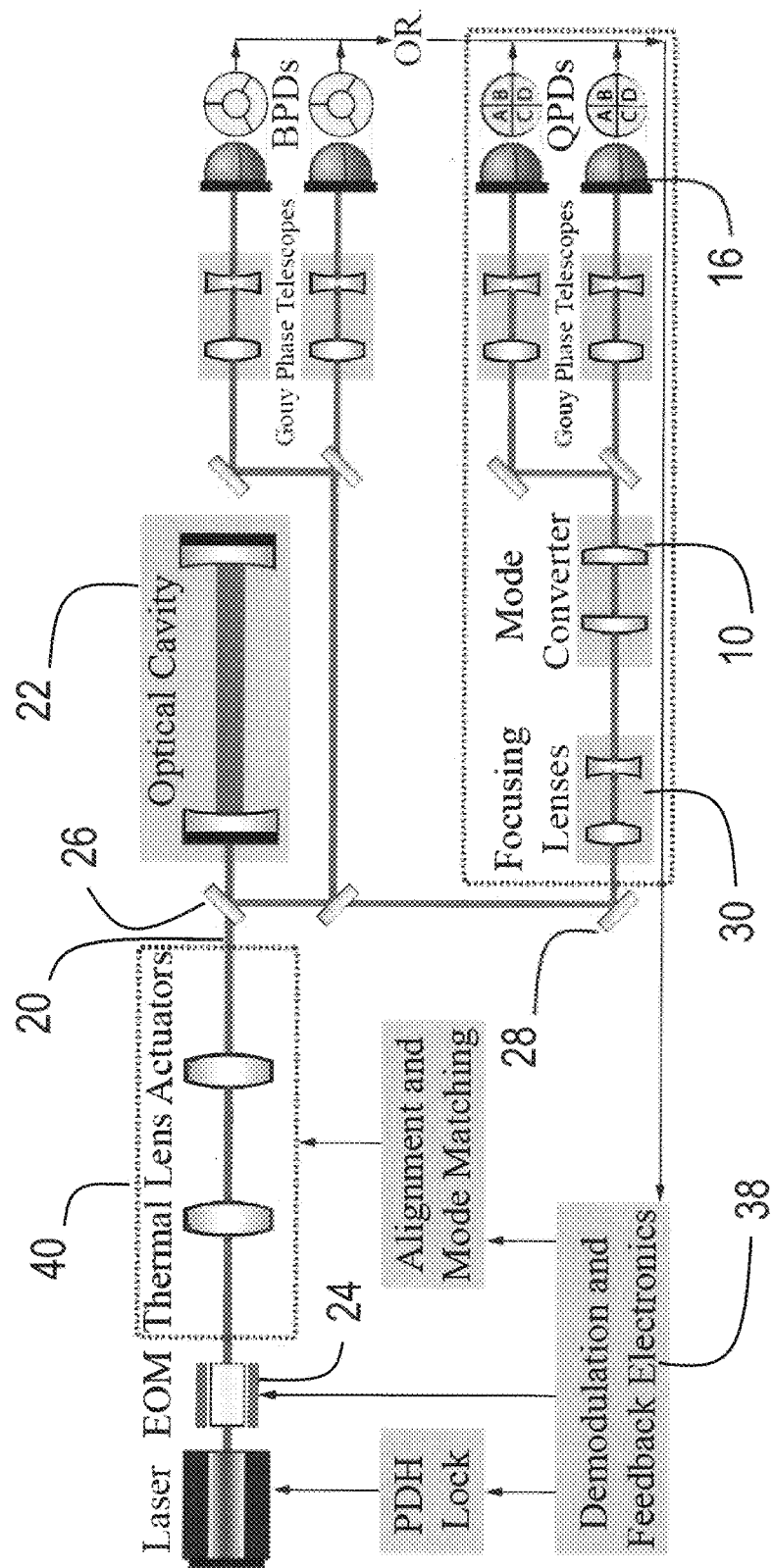
FIG. 11 is a schematic of testing of a mode mismatch signal conversion unit according to the present invention.
Figure 12:
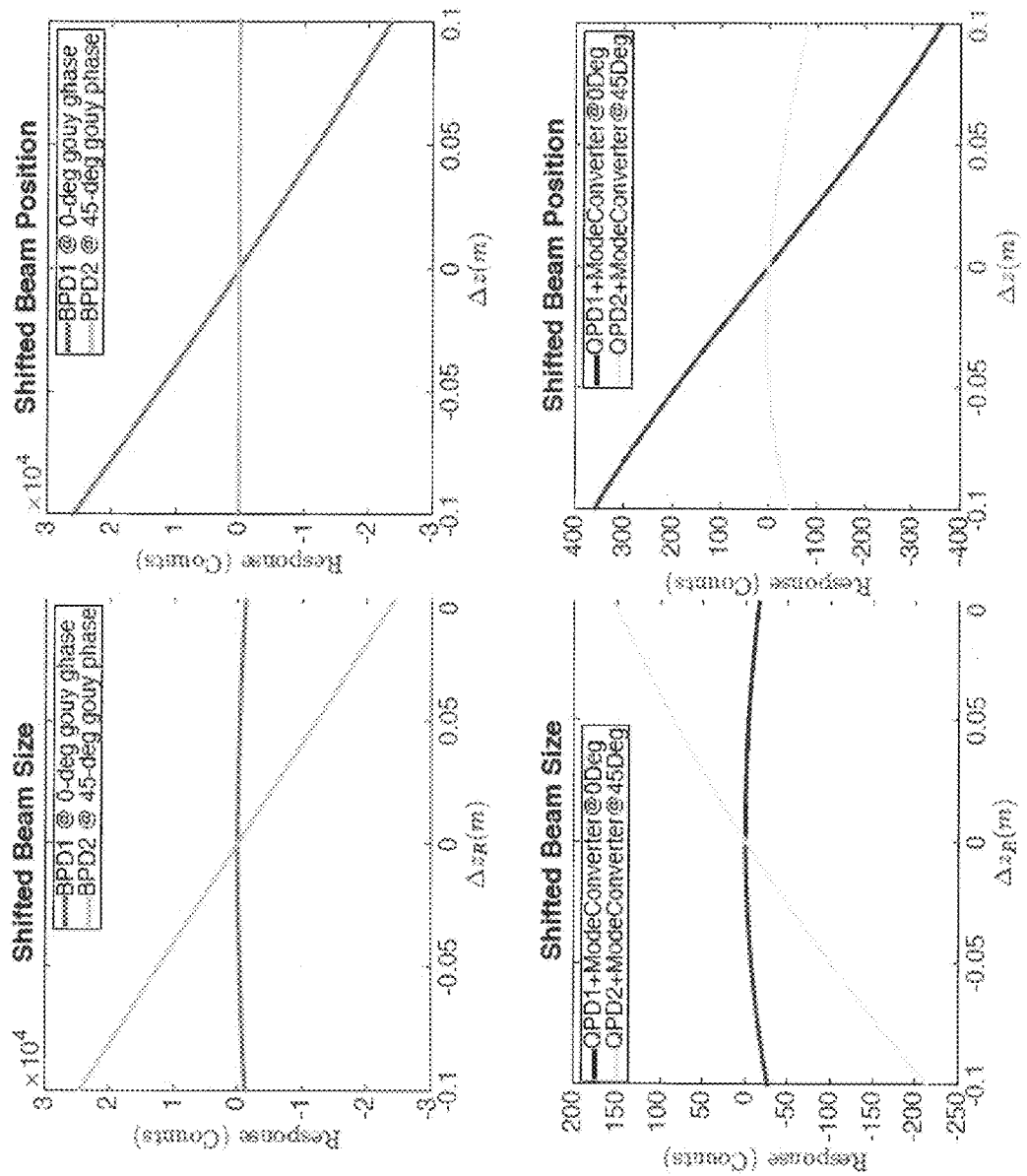
FIG. 12 is a series of graphs illustrating the results of testing using the arrangement of FIG. 11.

Referring to FIG. 11, a typical heterodyne detection approach was tested using BPDs compared to the proposed QPD plus a mode converter. The error signal produced by either the BPDs or QPDs is then fed back to thermal lens actuators which can adjust both alignment and mode matching. The top right and left plots of FIG. 12 were produced using a BPD sensor in FINESSE. The bottom right and left plots of FIG. 12 were produced using MATLAB. The MATLAB script passes beams through a Fourier optic representation of the mode converter. After conversion, a reference 00 beam is beat against a higher order mode. The result is then segmented into quadrants and combined A+D−B−C to produce the error signals plotted.

For the present invention, some design considerations are worth noting. First, after the mode converter the signals for pitch and yaw will be in different Gouy phases. For ideal sensing of all 6 degrees of freedom, 3 QPDs are needed at 0°, 45° and 90° Gouy phase separation. However, in practice a setup with 2 QPDs 67.5° apart may be sufficient. The beam should be focused so that the beam waist is in the middle of the mode converter. The cylindrical lens separation must be $f\sqrt{2}$, where f is the focal length of each of the cylindrical lenses. This constrains the Rayleigh range of the reference beam and therefore its beam size $w_0 = \sqrt{(1+1/\sqrt{2})f\lambda/\pi}$.

The benefits of mode converter with quadrant photodiodes according to the present invention include the ability to measure mode mismatch using existing QPD. The mode converter also preserves cavity misalignment signals. For the present invention, no new electronics or channels are needed and QPDs are easier to align than BPDs. Compared to BPDs, QPDs are off-the-shelf and have a much better matched quadrant capacities on optical gains. Only one mode converter, followed by normal Gouy phase telescopes for each sensor is needed to sense all four alignment and two mode-match degrees of freedom. The only optical component critically sensitive to beam size is the mode converter itself. It is much easier to change than the segment size of (multiple) BPD.

As described above, the present invention may be a system, a method, and/or a computer program associated therewith and is described herein with reference to flowcharts and block diagrams of methods and systems. The flowchart and block diagrams illustrate the architecture, functionality, and operation of possible implementations of systems, methods, and computer programs of the present invention. It should be understood that each block of the flowcharts and block diagrams can be implemented by computer readable program instructions in software, firmware, or dedicated analog or digital circuits. These computer readable program instructions may be implemented on the processor of a general purpose computer, a special purpose computer, or other programmable data processing apparatus to produce a machine that implements a part or all of any of the blocks in the flowcharts and block diagrams. Each block in the flowchart or block diagrams may represent a module, segment, or portion of instructions, which comprises one or more executable instructions for implementing the specified logical functions. It should also be noted that each block of the block diagrams and flowchart illustrations, or combinations of blocks in the block diagrams and flowcharts, can be implemented by special purpose hardware-based systems that perform the specified functions or acts or carry out combinations of special purpose hardware and computer instructions.

What is claimed is:

1. A system for sensing optical cavity mode mismatch, comprising:
    a mode converter having a pair of cylindrical lenses with a focal length, wherein the pair of lenses are spaced apart by the focal length multiplied by the square root of two; and
    a photodiode having quadrants aligned with the mode converter for sensing optical cavity mode mismatch.

2. The system of claim 1, wherein the focal length of the pair of lenses is a function of a waist size of an incoming beam.

3. The system of claim 2, further comprising a Gouy phase telescope positioned between the mode converter and the incoming beam.

4. The system of claim 3, wherein the incoming beam comprises an optical cavity reflection containing mismatched signals.

5. The system of claim 4, further comprising a mixer coupled to the photodiode for demodulating a signal output from the photodiode.

6. The system of claim 5, further comprising a set of feedback electronics coupled to an output of the mixer and controlling a mode matching actuator positioned between an electro-optic modulator and an optical cavity that will produce the optical cavity reflection.

7. The system of claim 6, further comprising an oscillator coupled between the electro-optic modulator and the mixer.

8. The system of claim 7, wherein the feedback electronics is configured to compare the quadrants of the photodiode to produce a mode mismatching error signal.

9. The system of claim 8, wherein the focal length of the pair of lenses is determined by $f(w_o) = (\pi w_o^2)/\lambda(1+1/\sqrt{2})$.

10. A method of sensing optical cavity mode mismatch, comprising the steps of:

passing an incoming beam through a mode converter having a pair of cylindrical lenses with a focal length, wherein the pair of lenses are spaced apart by the focal length multiplied by the square root of two; and detecting the incoming beam after the mode converter with a photodiode having quadrants to sense optical cavity mode mismatch.

11. The method of claim 10, wherein the focal length of the pair of lenses is a function of a waist size of an incoming beam.

12. The method of claim 11, further comprising the step of passing the incoming beam through a Gouy phase telescope before the mode converter.

13. The method of claim 12, wherein the incoming beam comprises an optical cavity reflection containing mismatched signals.

14. The method of claim 13, further comprising the step of using a mixer coupled to the photodiode for demodulating the signal output from the photodiode.

15. The method of claim 14, further comprising the step of using a set of feedback electronics coupled to an output of the mixer to control a mode matching actuator positioned between an electro-optic modulator and an optical cavity that will produce the optical cavity reflection.

16. The method of claim 15, further comprising an oscillator coupled between the electro-optic modulator and the mixer.

17. The method of claim 16, wherein the feedback electronics compares the quadrants of the photodiode to produce a mode mismatching error signal.

18. The method of claim 17, wherein the focal length of the pair of lenses is determined by $f(w_o) = (\pi w_o^2)/\lambda(1+1/\sqrt{2})$.

* * * * *